US012580534B2

(12) United States Patent
Khlat

(10) Patent No.: US 12,580,534 B2
(45) Date of Patent: Mar. 17, 2026

(54) TIME-ADVANCED PHASE CORRECTION IN A POWER AMPLIFIER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 1015 days.

(21) Appl. No.: 17/536,234

(22) Filed: Nov. 29, 2021

(65) Prior Publication Data

US 2022/0368293 A1 Nov. 17, 2022

Related U.S. Application Data

(60) Provisional application No. 63/188,029, filed on May 13, 2021.

(51) Int. Cl.
| | |
|---|---|
| *H03F 3/24* | (2006.01) |
| *H03F 1/02* | (2006.01) |
| *H03F 1/32* | (2006.01) |

(52) U.S. Cl.
CPC ........... *H03F 3/245* (2013.01); *H03F 1/0222* (2013.01); *H03F 1/3288* (2013.01); *H03F 2200/102* (2013.01); *H03F 2200/451* (2013.01)

(58) Field of Classification Search
CPC ...... H03F 3/245; H03F 1/0222; H03F 1/3288; H03F 2200/102; H03F 2200/451; H03F 3/19
USPC ........................................................ 330/149
See application file for complete search history.

(56) References Cited

U.S. PATENT DOCUMENTS

| | | | |
|---|---|---|---|
| 6,621,433 | B1 | 9/2003 | Hertz |
| 7,546,137 | B2 | 6/2009 | D'Hont et al. |
| 7,977,919 | B1 | 7/2011 | Jaoude et al. |
| 9,577,771 | B1 | 2/2017 | Lashkarian et al. |
| 9,755,579 | B1 | 9/2017 | Ahmed et al. |
| 11,165,515 | B2 | 11/2021 | Tiebout et al. |
| 11,533,068 | B1 * | 12/2022 | Sharma ............... H03M 1/0614 |

(Continued)

OTHER PUBLICATIONS

U.S. Appl. No. 17/564,734, filed Dec. 29, 2021.

(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

Time-advanced phase correction in a power amplifier circuit is disclosed. The power amplifier circuit includes a power amplifier that amplifies an analog signal, which is associated with a time-variant power envelope, based on a modulated voltage. To correct phase misalignment between the modulated voltage and the time-variant power envelope, the power amplifier circuit also includes a phase correction circuit that generates a modulated phase correction voltage based on the modulated voltage to thereby cause a phase change in the analog signal. However, the modulated phase correction voltage can lag behind the modulated voltage in time due, in part, to inherent group delay of the phase correction circuit. As such, the power amplifier circuit further includes a time advance circuit to time advance the modulated phase correction voltage to thereby realign the modulated phase correction voltage and the modulated voltage in time for an optimal phase correction in the analog signal.

20 Claims, 8 Drawing Sheets

(56) References Cited

U.S. PATENT DOCUMENTS

| | | | |
|---|---|---|---|
| 2007/0189417 | A1 | 8/2007 | Waheed et al. |
| 2012/0140852 | A1 | 6/2012 | Kato et al. |
| 2016/0164551 | A1 | 6/2016 | Khlat et al. |
| 2016/0249300 | A1 | 8/2016 | Tsai et al. |
| 2022/0069774 | A1 | 3/2022 | Emira et al. |
| 2022/0368283 | A1* | 11/2022 | Folkmann ................. H03F 3/19 |
| 2022/0368294 | A1 | 11/2022 | Khlat |
| 2022/0368295 | A1 | 11/2022 | Khlat |
| 2022/0368300 | A1 | 11/2022 | Khlat |
| 2023/0080652 | A1 | 3/2023 | Khlat et al. |

OTHER PUBLICATIONS

U.S. Appl. No. 17/536,189, filed Nov. 29, 2021.
U.S. Appl. No. 17/564,852, filed Dec. 29, 2021.
U.S. Appl. No. 17/552,791, filed Dec. 16, 2021.
Non-Final Office Action for U.S. Appl. No. 17/564,734, mailed Jul. 17, 2024, 9 pages.
Non-Final Office Action for U.S. Appl. No. 17/552,791, mailed Jun. 21, 2024, 6 pages.
Final Office Action for U.S. Appl. No. 17/564,734, mailed Sep. 25, 2024, 10 pages.
Non-Final Office Action for U.S. Appl. No. 17/536,189, mailed Oct. 1, 2024, 12 pages.
Non-Final Office Action for U.S. Appl. No. 17/564,852, mailed Oct. 1, 2024, 9 pages.
Notice of Allowance for U.S. Appl. No. 17/552,791, mailed Oct. 15, 2024, 7 pages.

* cited by examiner

1

TIME-ADVANCED PHASE CORRECTION IN A POWER AMPLIFIER CIRCUIT

RELATED APPLICATIONS

This application claims the benefit of provisional patent application Ser. No. 63/188,029, filed May 13, 2021, the disclosure of which is hereby incorporated herein by reference in its entirety.

FIELD OF THE DISCLOSURE

The technology of the disclosure relates generally to a power amplifier circuit configured to enable phase correction in an analog signal.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant ET voltage that closely tracks a time-variant power envelope of the RF signal(s). The time-variant voltage is typically generated by an ET integrated circuit (ETIC) in the wireless communication device. Notably, the time-variant ET voltage may be misaligned in time and/or phase with the time-variant power envelope of the RF signal(s) due to a group delay(s). As a result, the peaks of the time-variant ET voltage may become misaligned with the peaks of the time-variant power envelope, which may cause the power amplifier(s) to clip and distort the RF signal(s). In this regard, it is desirable to maintain good time and phase alignment between the time-variant ET voltage and the time-variant power envelope of the RF signal(s).

SUMMARY

Aspects disclosed in the detailed description include time-advanced phase correction in a power amplifier circuit. The power amplifier circuit includes a power amplifier that amplifies an analog signal, which is associated with a time-variant power envelope, based on a modulated voltage. As the modulated voltage and the analog signal are typically generated outside the power amplifier circuit, the modulated voltage and the time-variant power envelope can become misaligned in phase and/or time. To correct the phase misalignment, the power amplifier circuit also includes a phase correction circuit that generates a modulated phase correction voltage based on the modulated voltage to thereby cause a phase change in the analog signal. However, the modulated phase correction voltage can lag behind the modulated voltage in time due, in part, to an inherent group delay of the phase correction circuit. As such, the power amplifier circuit further includes a time advance circuit to time advance the modulated phase correction voltage to thereby realign the modulated phase correction voltage and the modulated voltage in time for an optimal phase correction in the analog signal.

In one aspect, a time advance circuit is provided. The time advance circuit includes multiple time advance branches each configured to time advance an input signal based on a respective one of multiple time advance terms to generate a respective one of multiple time-advanced signals. Each of the multiple time advance terms is a function of a selected time advance value. The time advance circuit also includes an output circuit. The output circuit is configured to combine the multiple time-advanced signals to thereby generate an output signal that is time-advanced from the input signal by the selected time advance value.

In another aspect, a power amplifier circuit is provided. The power amplifier circuit includes a power amplifier configured to amplify an analog signal having a time-variant power envelope based on a modulated voltage. The power amplifier circuit also includes a phase correction circuit configured to generate a modulated phase correction voltage based on the modulated voltage to thereby cause a phase change in the analog signal. The power amplifier circuit also includes a time advance circuit. The time advance circuit includes multiple time advance branches each configured to time advance the modulated phase correction voltage based on a respective one of multiple time advance terms to generate a respective one of multiple time-advanced currents. Each of the multiple time advance terms is a function of a selected time advance value. The time advance circuit also includes an output circuit. The output circuit is configured to combine the multiple time-advanced currents to thereby generate a time-advanced modulated phase correction voltage that is time-advanced from the modulated phase correction voltage by the selected time advance value.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
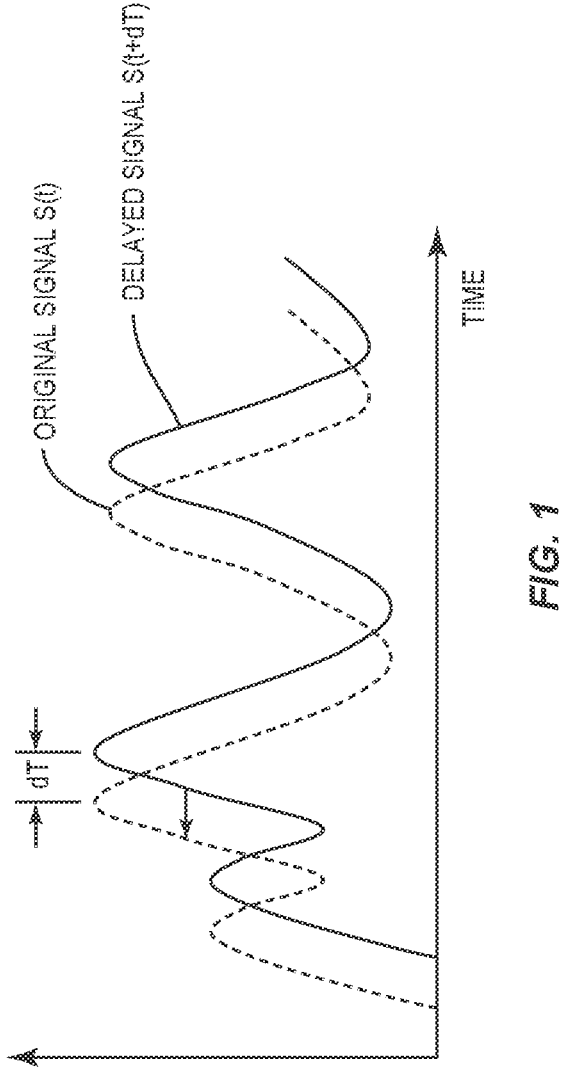
FIG. 1 is a graphic diagram providing an exemplary illustration of a delayed signal that lags behind an original signal in time by a temporal delay.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to time-advanced phase correction in a power amplifier circuit. The power amplifier circuit includes a power amplifier that amplifies an analog signal, which is associated with a time-variant power envelope, based on a modulated voltage. As the modulated voltage and the analog signal are typically generated outside the power amplifier circuit, the modulated voltage and the time-variant power envelope can become misaligned in phase and/or time. To correct the phase misalignment, the power amplifier circuit also includes a phase correction circuit that generates a modulated phase correction voltage based on the modulated voltage to thereby cause a phase change in the analog signal. However, the modulated phase correction voltage can lag behind the modulated voltage in time due, in part, to an inherent group delay of the phase correction circuit. As such, the power amplifier circuit further includes a time advance circuit to time advance the modulated phase correction voltage to thereby realign the modulated phase correction voltage and the modulated voltage in time for an optimal phase correction in the analog signal.

Figure 2:
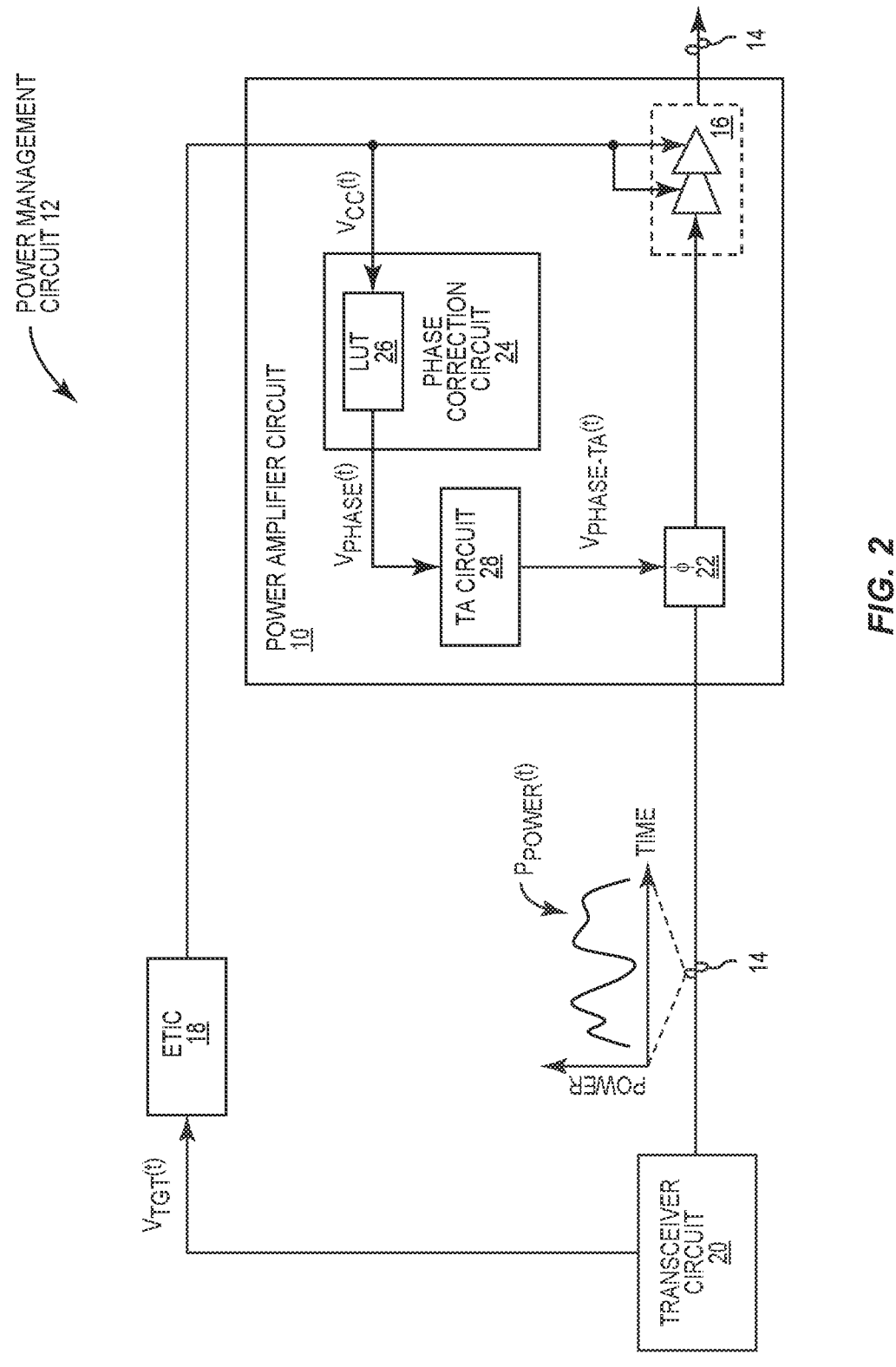
FIG. 2 is a schematic diagram of an exemplary power amplifier circuit provided in a power management circuit and configured according to embodiments of the present disclosure to enable time-advance phase correction in an analog signal.

Before discussing time-advanced phase correction in a power amplifier circuit, starting at FIG. 2, a brief discussion is first provided with reference to FIG. 1 to help define the term "time advance" in the context of the present disclosure.

FIG. 1 is a graphic diagram providing an exemplary illustration of a delayed signal S(t+dT) that lags behind an original signal S(t) in time by a temporal delay dT. As shown, the delayed signal S(t+dT) lags behind the original signal S(t) by a temporal delay dT. In this regard, to eliminate the temporal delay dT, it is necessary to move the original signal S(t) rightward in time by dT (a.k.a., time-delayed) to align with the delayed signal S(t+dT) or to move the delayed signal S(t+dT) leftward in time by -dT (a.k.a., time-advanced) to align with the original signal S(t). Thus, in the context of the present disclosure, the term "time-advanced" refers to a process, a method, and/or an algorithm that can cause the delayed signal S(t+dT) to align with the original signal S(t).

FIG. 2 is a schematic diagram of an exemplary power amplifier circuit 10 provided in a power management circuit 12 and configured according to embodiments of the present disclosure to enable time-advanced phase correction in an analog signal 14. The power amplifier circuit 10 includes a power amplifier 16 configured to amplify the analog signal 14 based on a modulated voltage $V_{CC}(t)$, which can be an envelope tracking (ET) modulated voltage or an average power tracking (APT) modulated voltage. The power amplifier 16 can be any type of power amplifier, including but not limited to a Doherty power amplifier, differential power amplifier, multi-stage power amplifier, single-stage power amplifier, and so on.

The power management circuit 12 can include an ET integrated circuit (ETIC) 18 and a transceiver circuit 20. The ETIC 18 can be configured to generate the modulated voltage $V_{CC}(t)$ based on a modulated target voltage $V_{TGT}(t)$ and provide the modulated voltage $V_{CC}(t)$ to the power amplifier circuit 10.

The transceiver circuit 20 can be configured to generate the analog signal 14, which is associated with a time-variant power envelope $P_{POWER}(t)$, and provides the analog signal 14 to the power amplifier circuit 10. The transceiver circuit 20 can also be configured to generate the modulated target voltage $V_{TGT}(t)$ to track the time-variant power envelope $P_{POWER}(t)$. In a non-limiting example, the transceiver circuit 20 can generate the modulated target voltage $V_{TGT}(t)$ based on a voltage lookup table (LUT) (not shown), such as an isogain LUT, that is preconfigured to correlate the time-variant power envelope $P_{POWER}(t)$ with the modulated target voltage $V_{TGT}(t)$.

Notably, since the modulated voltage $V_{CC}(t)$ and the analog signal 14 are both generated outside the power amplifier circuit 10, the modulated voltage $V_{CC}(t)$ and the analog signal 14 may experience different group delays when arriving at the power amplifier circuit 10. As such, the modulated voltage $V_{CC}(t)$ may become misaligned in phase and/or in time from the time-variant power envelope $P_{POWER}(t)$ of the analog signal 14. As a result, the power amplifier circuit 10 may cause a distortion (e.g., amplitude clipping) in the analog signal 14 during amplification.

In a non-limiting example, it is possible to realign the modulated voltage $V_{CC}(t)$ and the time-variant power envelope $P_{POWER}(t)$ in time by equalizing the modulated target voltage $V_{TGT}(t)$ (e.g., in the transceiver circuit 20) and/or the modulated voltage $V_{CC}$ (e.g., in the ETIC 18). In contrast, to realign the modulated voltage $V_{CC}(t)$ and the time-variant power envelope $P_{POWER}(t)$ in phase, the power amplifier circuit 10 is configured to include a phase shifter circuit 22 to perform a phase shift in the analog signal 14 such that the modulated voltage $V_{CC}(t)$ can be aligned in phase with the time-variant power envelope $P_{POWER}(t)$.

In this regard, the power amplifier circuit 10 is configured to include a phase correction circuit 24. In an embodiment, the phase correction circuit 24 is configured to generate a modulated phase correction voltage $V_{PHASE}(t)$ based on the modulated voltage $V_{CC}(t)$. In an embodiment, the phase correction circuit 24 can include a phase LUT 26 (e.g., an isophase LUT) that correlates the modulated voltage $V_{CC}(t)$ with the modulated phase correction voltage $V_{PHASE}(t)$. Accordingly, the phase correction circuit 24 can generate the modulated phase correction voltage $V_{PHASE}(t)$ based on the modulated voltage $V_{CC}(t)$. For an example of the phase correction circuit 24, please refer to U.S. patent application Ser. No. 17/536,189, now U.S. Pat. No. 12,381,514, entitled "POWER MANAGEMENT CIRCUIT SUPPORTING PHASE CORRECTION IN AN ANALOG SIGNAL."

The phase shifter circuit 22 may include internal storage (not shown), such as registers for example, to store a correlation between various levels of the modulated phase correction voltage $V_{PHASE}(t)$ and various degrees of phase shift. For example, to store a correlation between the modulated phase correction voltage $V_{PHASE}(t)$ of 0 V, 1 V, and 2 V and a phase shift of 0°, 1°, and 2°, respectively. Accordingly, the phase shifter circuit 22 can determine a phase shift based on the modulated phase correction voltage $V_{PHASE}(t)$ and phase-shift the analog signal 14 based on the determined phase shift.

However, the modulated phase correction voltage $V_{PHASE}(t)$ can lag behind the modulated voltage $V_{CC}(t)$ in time (e.g., 1 to 2 nanoseconds) due, in part, to an inherent group delay of the phase correction circuit 24. As a result, the phase shifter circuit 22 may not be able to achieve an optimal phase alignment between the modulated voltage $V_{CC}(t)$ and the analog signal 14.

In this regard, the power amplifier circuit 10 is further configured to include a time advance circuit 28. As discussed in detail below, the time advance circuit 28 is configured to generate a time-advanced modulated phase correction voltage $V_{PHASE-TA}(t)$ by time advancing the modulated phase correction voltage $V_{PHASE}(t)$ by a selected time advance value dT. In a non-limiting example, the selected time advance value dT can be less than or equal to a time offset between the modulated phase correction voltage $V_{PHASE}(t)$ and the modulated voltage $V_{CC}(t)$, which may be estimated or measured. Accordingly, the phase shifter circuit 22 can be configured to determine the phase shift based on the time-advanced modulated phase correction voltage $V_{PHASE-TA}(t)$ and phase-shift the analog signal 14 based on the determined phase shift. As a result, it is possible to realign the modulated phase correction voltage $V_{SENSE}(t)$ and the modulated voltage $V_{CC}(t)$ in time for an optimal phase correction in the analog signal 14.

In an embodiment, the time advance circuit 28 can be configured to generate the time-advanced modulated phase correction voltage $V_{PHASE-TA}(t)$ based on a time advance algorithm. In this regard, the time-advanced modulated phase correction voltage $V_{PHASE-TA}(t)$ is in fact a mathematical estimation (a.k.a. recreation) of the modulated phase correction voltage $V_{PHASE}(t)$ that is time-advanced by the selected time advance value dT. As such, the quality of the time-advance algorithm will determine how closely the time-advanced modulated phase correction voltage $V_{PHASE-TA}(t)$ can represent an ideally time-advanced version of the modulated phase correction voltage $V_{PHASE}(t)$.

A general form of the time advance algorithm is now discussed. The time advance algorithm discussed herein can be used to generate an output signal $S_{OUT}(t)$ that is time-advanced from an input signal $S_{IN}(t)$ by the selected time advance value dT. In a non-limiting example, the input signal $S_{IN}(t)$ is equivalent to the modulated phase correction voltage $V_{PHASE}(t)$ and the output signal $S_{OUT}(t)$ is equivalent to the time-advanced modulated phase correction voltage $V_{PHASE-TA}(t)$. Understandably, the input signal $S_{IN}(t)$ and the output signal $S_{OUT}(t)$ can also be other type of signals (e.g., electrical current, radio waveform, etc.).

The output signal $S_{OUT}(t)$ in an ideal form can be expressed in equation (Eq. 1) below.

$$S_{OUT}(t) = S_{IN}(t+dT) \qquad \text{(Eq. 1)}$$

The equation (Eq. 1) can be rewritten as equation (Eq. 1.1) below.

$$S_{OUT}(t) = S_{IN}(t) + [S_{IN}(t+dT) - S_{IN}(t)] \qquad \text{(Eq. 1.1)}$$

Assuming that $S_{IN}(t+dT)-S_{IN}(t)$ is approximately identical to $S_{IN}(t)-S_{IN}(t-dT)$ and using $\Delta S_{INdT}(t)$ to represent $[S_{IN}(t+dT)-S_{IN}(t)]$, an approximated time-advanced input signal $S_{IN-TA}(t)$ can thus be expressed in equation (Eq. 2) below.

$$S_{IN-TA}(t) = S_{IN}(t) + \Delta S_{INdT}(t) \qquad \text{(Eq. 2)}$$
$$= S_{IN}(t) + S_{IN}(t) - S_{IN}(t-dT)$$
$$= 2 * S_{IN}(t) - S_{IN}(t-dT)$$

By applying the equation (Eq. 2) to $\Delta S_{INdT}(t)$, it is possible to establish equation (Eq. 3) below.

$$\Delta S_{INdT-TA}(t) = 2 * \Delta S_{INdT}(t) - \Delta S_{INdT}(t-dT) \qquad \text{(Eq. 3)}$$
$$= 2 * [S_{IN}(t) - S_{IN}(t-dT)] -$$
$$[S_{IN}(t-dT) - S_{IN}(t-2dT)]$$
$$= 2 * S_{IN}(t) - 3 * S_{IN}(t-dT) + S_{IN}(t-2dT)$$

Accordingly, the time-advanced input signal $S_{IN-TA}(t)$ can be further improved from the equation (Eq. 2) in equation (Eq. 4) below.

$$S_{IN-TA}(t) = \qquad \text{(Eq. 4)}$$
$$S_{IN}(t) + \Delta S_{INdT-TA}(t) = 3 * S_{IN}(t) - 3 * S_{IN}(t-dT) + S_{IN}(t-2dT)$$

By further applying the equation (Eq. 2) to $\Delta^2 S_{INdT}(t)$, it is possible to further improve the equation (Eq. 4) in equation (Eq. 5) below.

$$S_{IN-TA}(t) = 4 * S_{IN}(t) - 6 * S_{IN}(t-dT) + 4 * S_{IN}(t-2dT) - S_{IN}(t-3dT) \qquad \text{(Eq. 5)}$$

Based on the equations (Eq. 4 and Eq. 5), the general form of the time advance algorithm can be extrapolated as in equation (Eq. 6) below.

$$S_{IN-TA}(t) = \sum_{i=0}^{N} a_i * S_{IN}(t-i*dT) \qquad \text{(Eq. 6)}$$

In the equation (Eq. 6) above, $a_i$ ($0 \le i \le N$) is a multiplier that can be a positive or negative integer. More specifically, $a_i$ is positive when i is an even integer (e.g., 0, 2, 4, ...) and negative when i is an odd integer (e.g., 1, 3, 5, ...). The equation (Eq. 6) includes (N+1) time advance terms $a_i S_{IN}(t-i*dT)$ ($0 \le i \le N$). Each of the time advance terms is a function of the input signal $S_{IN}(t)$ and the selected time advance value dT. Understandably, the more time advance terms $a_i S_{IN}(t-i*dT)$ there is in the equation (Eq. 6), the more accurately the approximated time-advanced input signal $S_{IN-TA}(t)$ will represent the ideal output signal $S_{OUT}(t)$.

Figure 3:
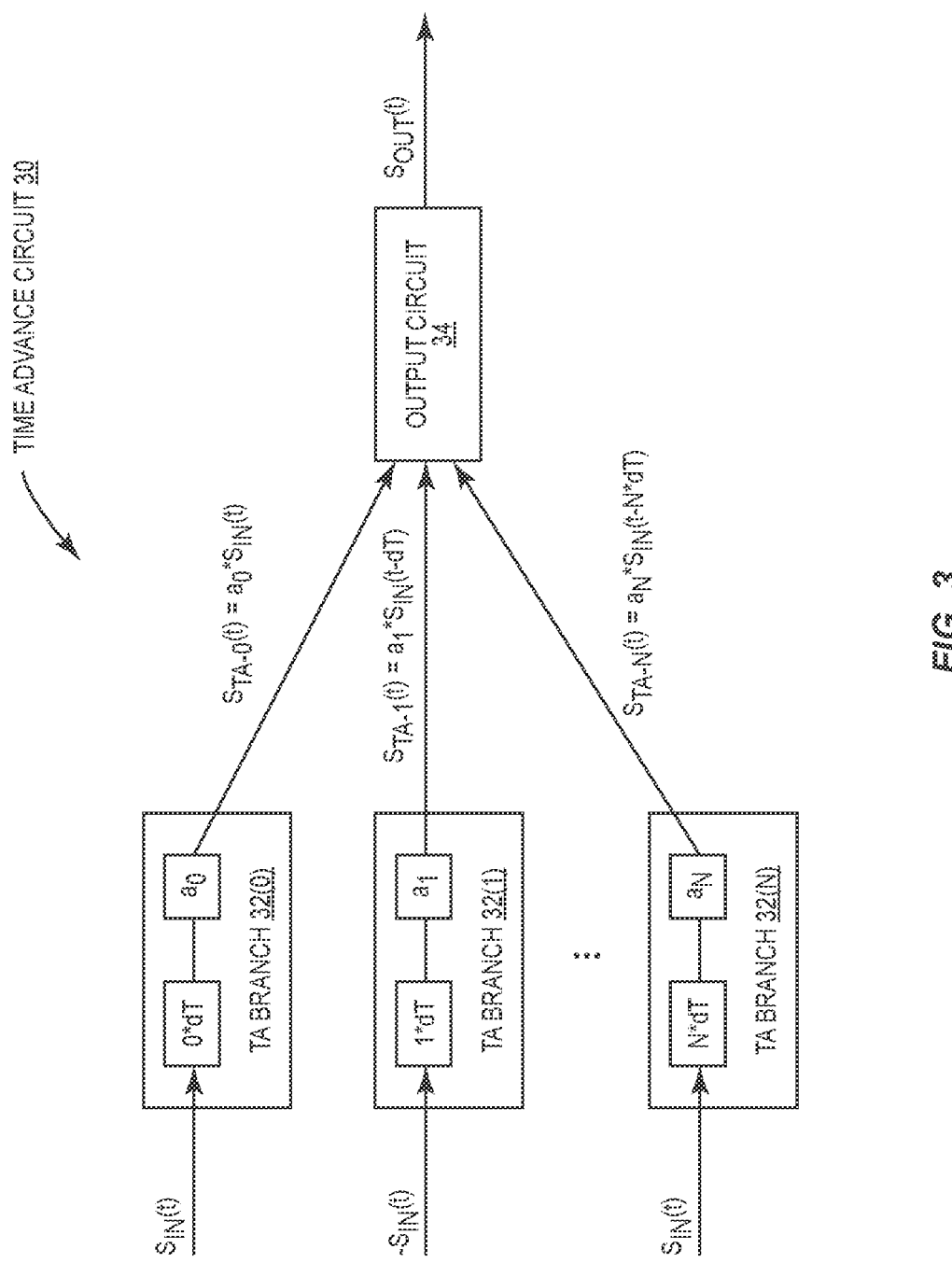
FIG. 3 is a schematic diagram of an exemplary time advance circuit that implements a time advance algorithm.

The time advance equation (Eq. 6) can be implemented in a circuit. In this regard, FIG. 3 is a schematic diagram of an exemplary time advance circuit 30 that implements the time advance algorithm as shown in the equation (Eq. 6). As further discussed in FIGS. 4 and 5, the time advance circuit 30 can be adapted according to embodiments of the present disclosure to function as the time advance circuit 28 in the power amplifier circuit 10 of FIG. 2.

The time advance circuit 30 includes multiple time advance branches 32(0)-32(N). Each of the time advance branches 32(0)-32(N) is configured to time advance the input signal $S_{IN}(t)$ based on a respective one of the time advance terms $a_i S_{IN}(t-i*dT)$ ($0 \le i \le N$) to generate a respective one of multiple time-advanced signals $S_{TA-0}(t)$-$S_{TA-N}(t)$. For example, the time advance branch 32(0) implements the multiplier $a_0$ and the time advance value $0*dT$ in the time advance term $a_0 * S_{IN}(t-0*dT)$ to generate the time-advanced signal $S_{TA-0}(t) = a_0 * S_{IN}(t)$, the time advance branch 32(1) implements the multiplier $a_1$ and the time advance value $1*dT$ in the time advance term $a_1 * S_{IN}(t-1*dT)$ to generate the time-advanced signal $S_{TA-1}(t) = a_1 * S_{IN}(t-dT)$, and so on.

As mentioned earlier, the multiplier $a_i$ is positive when i is an even integer (e.g., 0, 2, 4, ...) and negative when i is an odd integer (e.g., 1, 3, 5, ...). In this regard, in one embodiment, the input signal $S_{IN}(t)$ can be generated as a differential input signal $\pm S_{IN}(t)$. More specifically, the positive input signal $+S_{IN}(t)$ is provided to even-numbered time advance branches 32(0), 32(2), 32(4), and so on, while the negative input signal $-S_{IN}(t)$ is provided to odd-numbered time advance branches 32(1), 32(3), 32(5), and so on.

The time advance circuit 30 also includes an output circuit 34 coupled to each of the time advance branches 32(0)-32(N). The output circuit 34 is configured to combine the time-advanced signals $S_{TA-0}(t)$-$S_{TA-N}(t)$ to generate an output signal $S_{OUT}(t)$ that is time-advanced from the input signal $S_{IN}(t)$ by the selected time advance value dT.

The time advance circuit 30 can be adapted according to an embodiment of the present disclosure to generate the time-advanced modulated phase correction voltage $V_{PHASE-TA}(t)$ in the power amplifier circuit 10 of FIG. 2.

Figure 4:
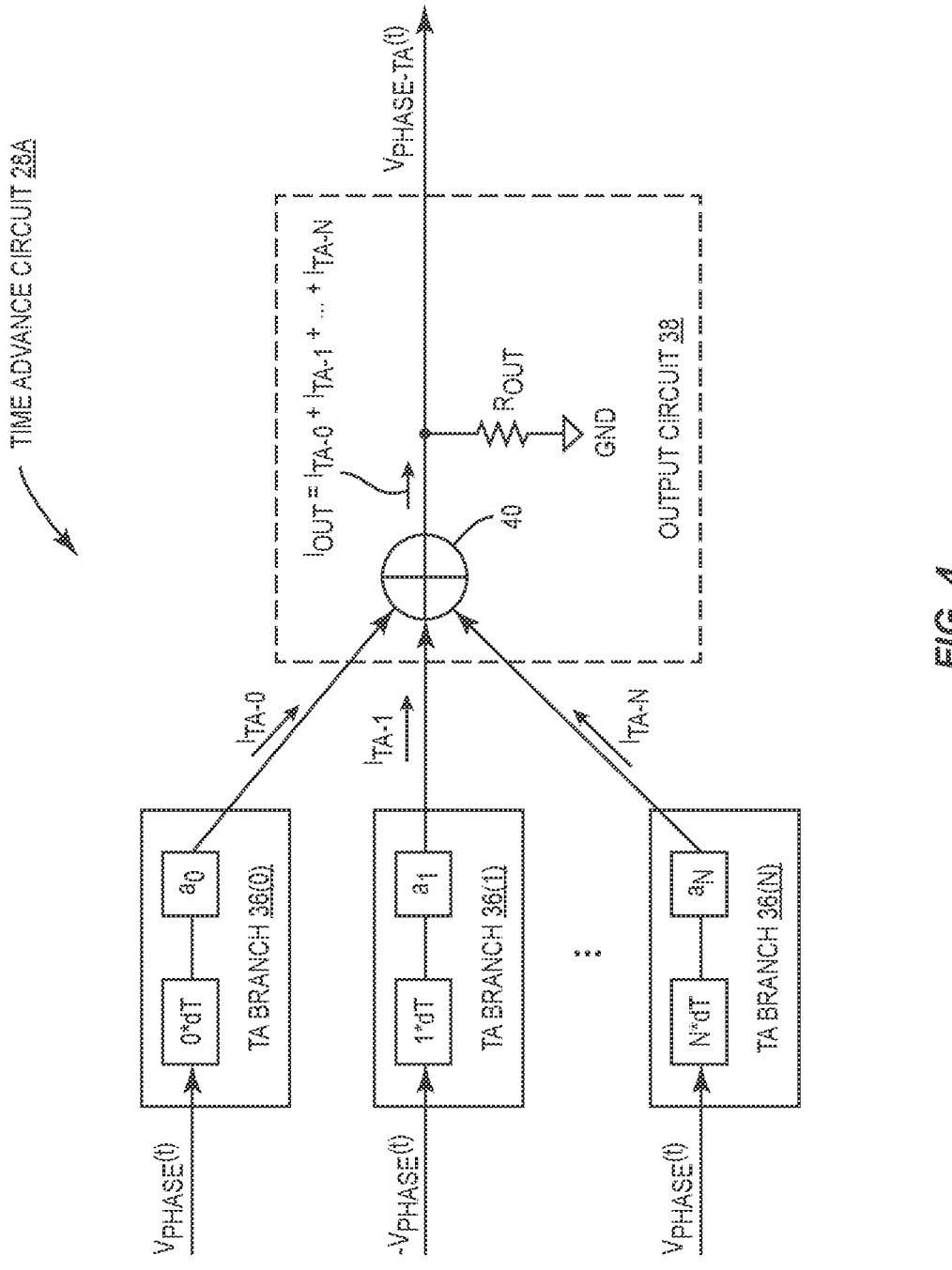
FIG. 4 is a schematic diagram of an exemplary time advance circuit, which is adapted from the time advance circuit of FIG. 3 according to an embodiment of the present disclosure and can be provided in the power amplifier circuit of FIG. 2 as a time advance circuit.

In this regard, FIG. 4 is a schematic diagram of an exemplary time advance circuit 28A, which is adapted from the time advance circuit 30 of FIG. 3 according to an embodiment of the present disclosure and can be provided in the power amplifier circuit 10 of FIG. 2 as the time advance circuit 28. Common elements between FIGS. 2, 3, and 4 are shown therein with common element numbers and will not be re-described herein.

Recall that, in the power amplifier circuit 10 in FIG. 2, the time advance circuit 28 is configured to time advance the modulated phase correction voltage $V_{PHASE}(t)$ by the selected time advance value dT to generate the time-advanced phase correction voltage $V_{PHASE-TA}(t)$. In this regard, the modulated phase correction voltage $V_{PHASE}(t)$ is equivalent to the input signal $S_{IN}(t)$ and the time-advanced phase correction voltage $V_{PHASE-TA}(t)$ is equivalent to the output signal $S_{OUT}(t)$ in FIG. 3.

The time advance circuit 28A includes multiple time advance branches 36(0)-36(N). Each of the time advance branches 36(0)-36(N) is configured to time advance the modulated phase correction voltage $V_{PHASE}(t)$ based on a respective one of the time advance terms $a_i S_{IN}(t-i*dT)$ ($0 \le i \le N$) to generate a respective one of multiple time-advanced currents $I_{TA-0}$-$I_{TA-N}$. For example, the time advance branch 36(0) implements the multiplier $a_0$ and the time advance value $0*dT$ in the time advance term $a_0 * S_{IN}(t-0*dT)$ to generate the time-advanced current $I_{TA-0}$, the time advance branch 36(1) implements the multiplier $a_1$ and the time advance value $1*dT$ in the time advance term $a_1 * S_{IN}(t-1*dT)$ to generate the time-advanced current $I_{TA-1}$, and so on.

The time advance circuit 28A also includes an output circuit 38. In a non-limiting example, the output circuit 38 includes a current combiner 40 and an output resistor $R_{OUT}$. The current combiner 40 is coupled to each of the time advance branches 36(0)-36(N) and configured to combine the time-advanced currents $I_{TA-0}$-$I_{TA-N}$ to generate an output current $I_{OUT}$. The output resistor $R_{OUT}$ is coupled to the current combiner 40 and configured to convert the output current $I_{OUT}$ into the time-advanced phase correction voltage $V_{PHASE-TA}(t)$, which is time-advanced from the phase correction voltage $V_{PHASE}(t)$ by the selected time advance value dT.

Similar to the time advance circuit 30 of FIG. 3, the phase correction voltage $V_{PHASE}(t)$ can be generated as a differential phase correction voltage $\pm V_{PHASE}(t)$. More specifically, the positive phase correction voltage $+V_{PHASE}(t)$ is provided to even-numbered time advance branches 36(0), 36(2), 36(4), and so on, while the negative phase correction voltage $-V_{PHASE}(t)$ is provided to odd-numbered time advance branches 36(1), 36(3), 36(5), and so on.

Figure 5:
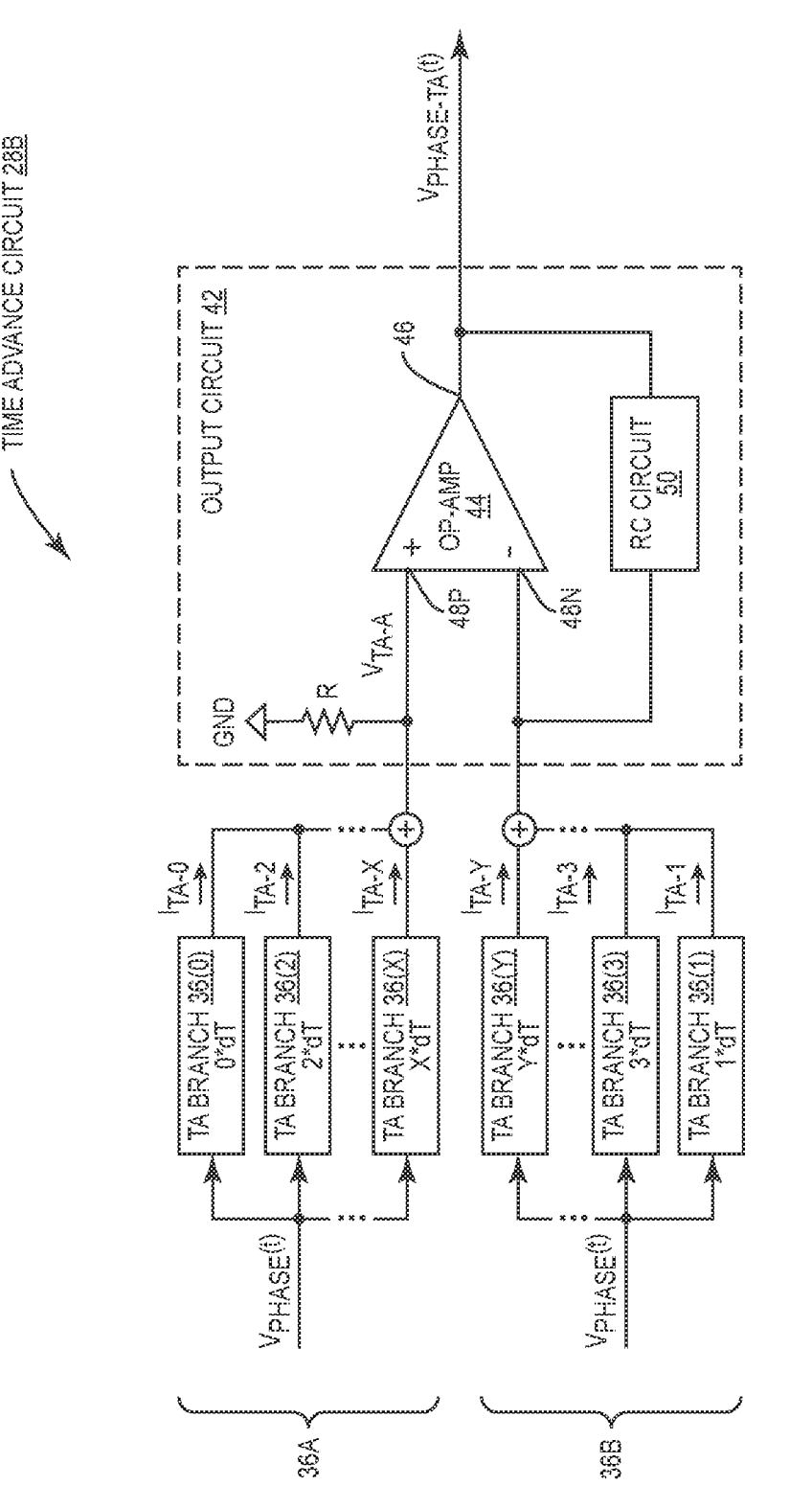
FIG. 5 is a schematic diagram of an exemplary time advance circuit, which is adapted from the time advance circuit of FIG. 4 according to another embodiment of the present disclosure and can be provided in the power amplifier circuit of FIG. 2 as a time advance circuit.

FIG. 5 is a schematic diagram of an exemplary time advance circuit 28B, which is adapted from the time advance circuit 30 of FIG. 3 according to another embodiment of the present disclosure and can be provided in the power amplifier circuit 10 of FIG. 2 as the time advance circuit 28. Common elements between FIGS. 2, 3, 4, and 5 are shown therein with common element numbers and will not be re-described herein.

Herein, the time advance branches 36(0)-36(N) are divided into a first subset 36A and a second subset 36B. The first subset 36A includes all even-indexed time advance branches 36(0), 36(2), . . . , 36(X) among the time advance branches 36(0)-36(N), wherein X is a largest even integer that is less than or equal to N. The second subset 36B includes all odd-indexed time advance branches 36(1), 36(3), . . . , 36(Y) among the time advance branches 36(0)-36(N), wherein Y is a largest odd integer that is less than or equal to N. Specifically, Y=X−1 when N is an even integer. In contrast, Y=X+1 when N is an odd integer.

In this regard, the even-indexed time advance branches 36(0), 36(2), . . . , 36(X) in the first subset 36A are each configured to time advance the phase correction voltage $V_{PHASE}(t)$ by a respective even-numbered multiple of the selected time advance value dT. For example, the time advance branch 36(0) will time advance the phase correction voltage $V_{PHASE}(t)$ by 0*dT, the time advance branch 36(2) will time advance the phase correction voltage $V_{PHASE}(t)$ by 2*dT, and so on.

In contrast, the odd-indexed time advance branches 36(1), 36(3), . . . , 36(Y) in the second subset 36B are each configured to time advance the phase correction voltage $V_{PHASE}(t)$ by a respective odd-numbered multiple of the selected time advance value dT. For example, the time advance branch 36(1) will time advance the phase correction voltage $V_{PHASE}(t)$ by 1*dT, the time advance branch 36(3) will time advance the phase correction voltage $V_{PHASE}(t)$ by 3*dT, and so on.

The time advance circuit 28B includes an output circuit 42. In a non-limiting example, the output circuit 42 includes an operational amplifier 44 (denoted as "OP-AMP"). The operational amplifier 44 includes an output terminal 46, a positive input terminal 48P, and a negative input terminal 48N. The output terminal 46 will output time-advanced phase correction voltage $V_{PHASE-TA}(t)$. The positive input terminal 48P is coupled to the first subset 36A of the time advance branches 36(0)-36(N). The negative input terminal 48N is coupled to the second subset 36B of the time advance branches 36(0)-36(N). Notably, by coupling the negative input terminal 48N to the odd-indexed time advance branches 36(1), 36(3), . . . , 36(Y) in the second subset 36B, it is no longer necessary to provide the negative phase correction voltage $-V_{PHASE}(t)$ to the odd-indexed time advance branches 36(1), 36(3), . . . , 36(Y).

Notably, the time advance branches 36(0)-36(N) in the time advance circuit 28B are identical to the time advance branches 36(0)-36(N) in the time advance circuit 28A of FIG. 4. As such, the first subset 36A of the time advance branches 36(0)-36(N) are each configured to generate a respective one of a first subset of time-advanced currents $I_{TA-0}$, $I_{TA-2}$, . . . , $I_{TA-X}$. Similarly, the second subset 36B of the time advance branches 36(0)-36(N) are each configured to generate a respective one of a second subset of time-advanced currents $I_{TA-1}$, $I_{TA-3}$, . . . , $I_{TA-Y}$.

The output circuit 42 includes a resistor R, which is coupled between the positive input terminal 48P and a ground (GND). The resistor R is configured to convert the first subset of time-advanced currents $I_{TA-0}$, $I_{TA-2}$, . . . , $I_{TA-X}$ into a first subset of time-advanced voltages $V_{TA-A}$. The output circuit 42 also includes a resistor-capacitor (RC) circuit 50. The RC circuit 50 is coupled between the negative input terminal 48N and the output terminal 46. The RC circuit 50 is configured to convert the second subset of time-advanced currents $I_{TA-1}$, $I_{TA-3}$, . . . , $I_{TA-Y}$ into a second subset of time-advanced voltages $V_{TA-B}$.

Accordingly, the operational amplifier 44 combines the first subset of time-advanced voltages $V_{TA-A}$ and the second subset of time-advanced voltages $V_{TA-B}$ to generate the time-advanced phase correction voltage $V_{PHASE-TA}(t)$ that is time advanced from the phase correction voltage $V_{PHASE}(t)$ by the selected time advance value dT.

Figure 6:
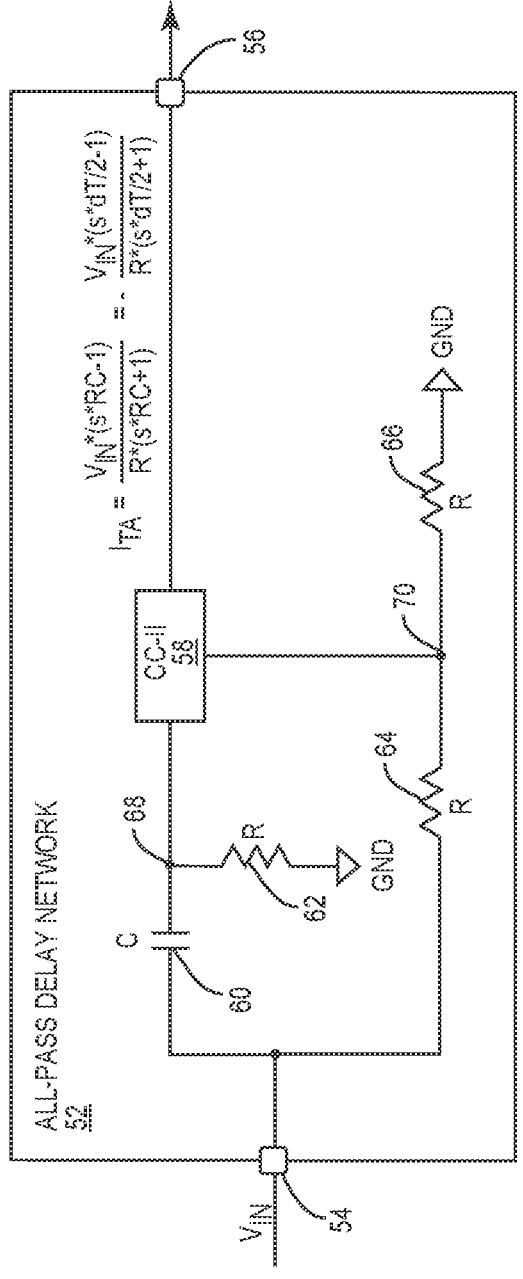
FIG. 6 is a schematic diagram of an exemplary all-pass delay network that can function as a time advance branch in the time advance circuits of FIGS. 4 and 5.

In an embodiment, each of the time advance branches 36(0)-36(N) in the time advance circuit 28A of FIG. 4 and the time advance circuit 28B of FIG. 5 can be implemented by an all-pass delay network. In this regard, FIG. 6 is a schematic diagram of an exemplary all-pass delay network 52 that can function as any of the time advance branches 36(0)-36(N) in the time advance circuit 28A of FIG. 4 and the time advance circuit 28B of FIG. 5.

The all-pass delay network 52 includes a voltage input 54, a current output 56, a current conveyor circuit 58 (denoted as "CC-II"), a capacitor 60, a first resistor 62, a second resistor 64, and a third resistor 66. The voltage input 54 will receive an input voltage $V_{IN}$, which will be the phase correction voltage $V_{PHASE}(t)$ when the all-pass delay network 52 is provided in the time advance circuit 28A of FIG. 4 and the time advance circuit 28B of FIG. 5. The current output 56 will output a time-advanced current $I_{TA}$, which can be any of time-advanced currents $I_{TA-0}$-$I_{TA-N}$ in the time advance circuit 28A of FIG. 4 and the time advance circuit 28B of FIG. 5.

The capacitor 60 is coupled in series with the current conveyor circuit 58 between the voltage input 54 and the current output 56. The first resistor 62 is coupled between a first coupling node 68, which is located in between the capacitor 60 and the current conveyor circuit 58, and the GND. The second resistor 64 and the third resistor 66 are coupled in series between the voltage input 54 and the GND. The current conveyor circuit 58 is further coupled to a second coupling node 70, which is located in between the second resistor 64 and the third resistor 66. The capacitor 60 has a capacitance C. The first resistor 62, the second resistor 64, and third resistor 66 have an identical resistance R.

The all-pass delay network 52 can be adapted to implement each of the time advance terms $a_iS_{IN}(t-i*dT)$ ($0 \le i \le N$), as shown in the equation (Eq. 6). In a non-limiting example, each the time advance terms $a_iS_{IN}(t-i*dT)$ is a first-order transfer function as shown in equation (Eq. 7) below.

$$I_{TA} = \frac{V_{IN} * \left(s * \frac{dT}{2} - 1\right)}{R * \left(s * \frac{dT}{2} + 1\right)}$$ (Eq. 7)

In the equation (Eq. 7) above, the multiplier as in each of the time advance terms $a_iS_{IN}(t-i*dT)$ is set by 1/R and the selected time advance value dT is equal to 2*R*C. As such, the all-pass delay network 52 can be adapted to implement each of the time advance terms $a_iS_{IN}(t-i*dT)$ by adapting the capacitance C and the resistance R.

With reference back to FIG. 4, it should be understandable from earlier discussions that the time-advanced phase correction voltage $V_{PHASE-TA}(t)$ can be generated to more accurately represent the phase correction voltage $V_{PHASE}(t)$ by employing a larger number of the time advance branches 36(0)-36(N). However, it may not be practical in a real implementation to include an excessive number of the time advance branches 36(0)-36(N) due to concerns such as complexity, footprint, cost, etc. Fortunately, a simulation result shows that the time-advanced phase correction voltage $V_{PHASE-TA}(t)$ generated based on the equation (Eq. 3) can also be a very good representation of the phase correction voltage $V_{PHASE}(t)$.

Figure 7:
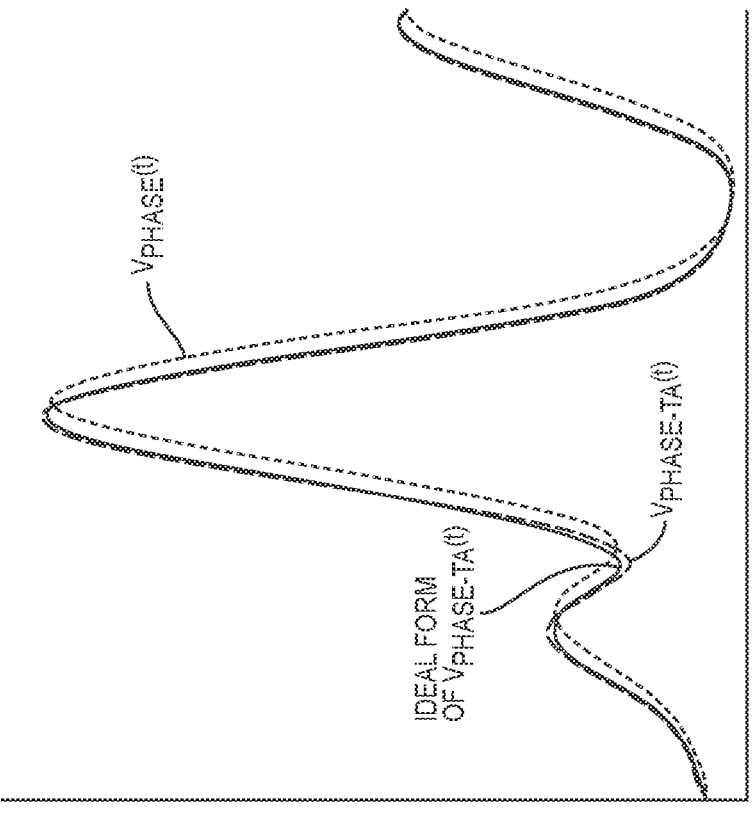
FIG. 7 is a graphic diagram providing an exemplary illustration as to how the time advance circuit of FIG. 4 can be simplified.

In this regard, FIG. 7 is a graphic diagram providing an exemplary illustration as to how the time advance circuit of FIG. 4 can be simplified. FIG. 7 illustrates a simulation result of a time advance circuit configured according to the equation (Eq. 3). As illustrated, the time-advanced phase correction voltage $V_{PHASE-TA}(t)$ as generated based on the equation (Eq. 3) is very close to an ideal form of the time-advanced phase correction voltage $V_{PHASE-TA}(t)$. The simulation result in FIG. 7 proves that the time advance algorithm as defined in the equation (Eq. 3) may be adequate for generating the time-advanced phase correction voltage $V_{PHASE-TA}(t)$.

Figure 8:
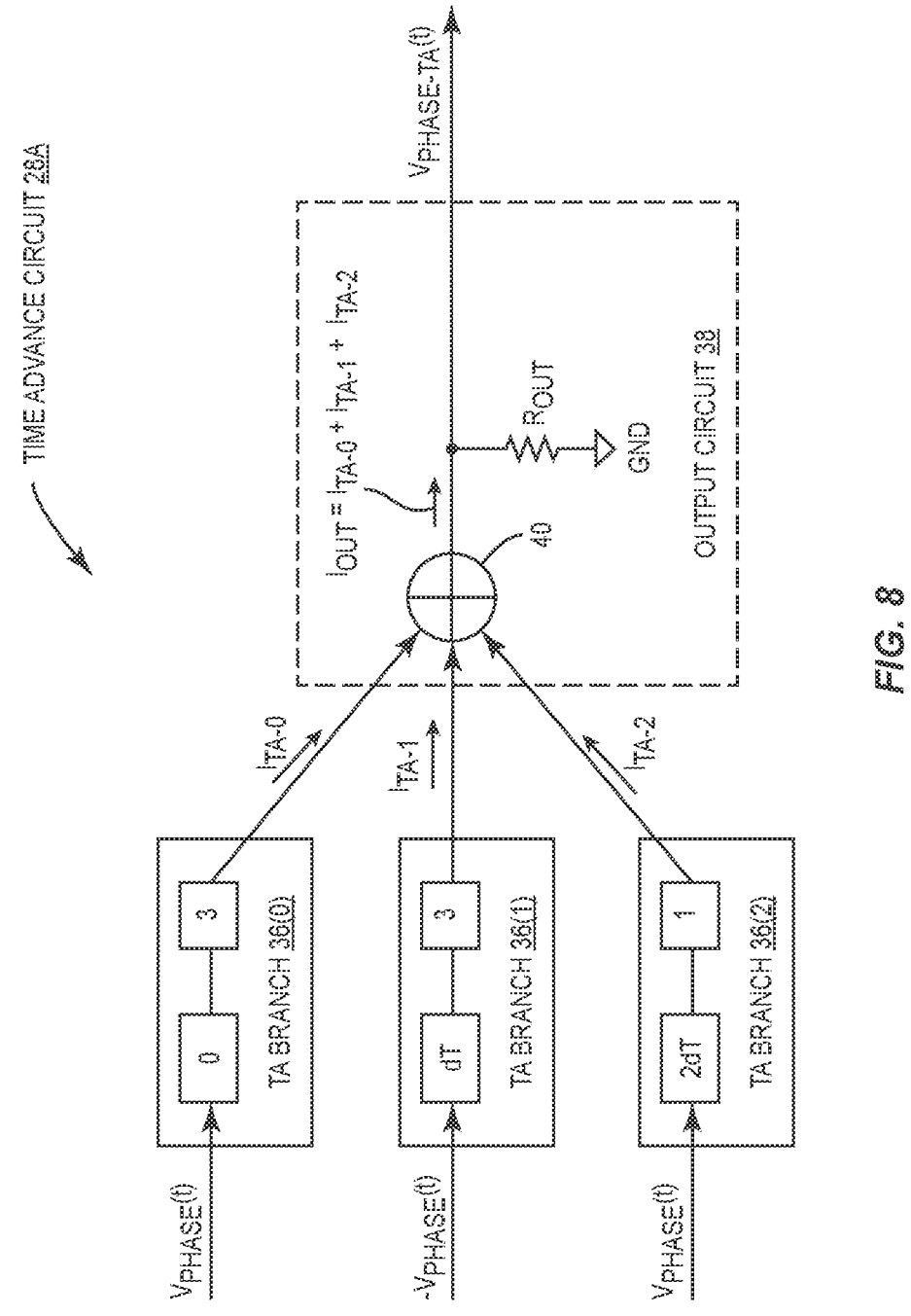
FIG. 8 is a schematic diagram illustrating a simplified version of the time advance circuit of FIG. 4.

As such, FIG. 8 is a schematic diagram illustrating a simplified version of the time advance circuit 28A of FIG. 4. Common elements between FIGS. 4 and 8 are shown therein with common element numbers and will not be re-described herein.

Herein, the time advance circuit 28A is simplified to include only three (3) time advance branches 36(0), 36(1), and 36(2), each operating in the same way as previously described in FIG. 4. The simplified version of the time advance circuit 28A, as shown herein, is more practical in the real word as it helps to reduce complexity, footprint, and cost of the power amplifier circuit 10.

Those skilled in the art will recognize improvements and modifications to the preferred embodiments of the present disclosure. All such improvements and modifications are considered within the scope of the concepts disclosed herein and the claims that follow.

What is claimed is:

1. A time advance circuit comprising:
a plurality of time advance branches each configured to time advance an analog input signal based on a respective one of a plurality of time advance terms to generate a respective one of a plurality of time-advanced analog signals, wherein each of the plurality of time advance terms is a function of a selected time advance value; and
an output circuit configured to combine the plurality of time-advanced analog signals to thereby generate an analog output signal that is time-advanced from the analog input signal by the selected time advance value.

2. The time advance circuit of claim 1, wherein the plurality of time advance branches is further configured to:
receive an input voltage as the analog input signal; and
generate a respective one of a plurality of time-advanced currents as the respective one of the plurality of time-advanced analog signals based on the respective one of the plurality of time advance terms.

3. The time advance circuit of claim 2, wherein the plurality of time advance branches comprises:
a voltage input that receives the input voltage;
a current output that outputs the respective one of the plurality of time-advanced currents;
a capacitor coupled in series with a current conveyor circuit between the voltage input and the current output;
a first resistor coupled between a first coupling node and a ground, wherein the first coupling node is located in between the capacitor and the current conveyor circuit;
a second resistor and a third resistor coupled in series between the voltage input and the ground; and
a second coupling node coupled to the current conveyor circuit, wherein the second coupling node is located in between the second resistor and the third resistor.

4. The time advance circuit of claim 3, wherein the respective one of the plurality of time advance terms is a first-order transfer function expressed as:

$$\frac{V_{IN} * \left(s * \frac{dT}{2} - 1\right)}{R * \left(s * \frac{dT}{2} + 1\right)},$$

wherein:
$V_{IN}$ represents the input voltage;
R represents a resistance that is identical for the first resistor, the second resistor, and the third resistor; and
dT represents the selected time advance value.

5. The time advance circuit of claim 4, wherein the selected time advance value in each of the plurality of time advance branches is equal to 2*R*C, wherein C represents a capacitance of the capacitor.

6. The time advance circuit of claim 2, wherein the output circuit comprises:
a current combiner configured to combine the plurality of time-advanced currents to generate an output current as the analog output signal; and
an output resistor coupled to the current combiner and configured to convert the output current into an output voltage that is time-advanced from the input voltage by the selected time advance value.

7. The time advance circuit of claim 2, wherein the output circuit comprises an operational amplifier, and the operational amplifier comprises:
an output terminal that outputs an output voltage as the analog output signal;
a positive input terminal coupled to a first subset of the plurality of time advance branches each configured to generate a respective one of a first subset of the plurality of time-advanced currents;
a negative input terminal coupled to a second subset of the plurality of time advance branches each configured to generate a respective one of a second subset of the plurality of time-advanced currents;

a resistor coupled between the positive input terminal and a ground, the resistor is configured to convert the first subset of the plurality of time-advanced currents into a first subset of time-advanced voltages; and a resistor-capacitor (RC) circuit coupled between the negative input terminal and the output terminal, the RC circuit is configured to convert the second subset of the plurality of time-advanced currents into a second subset of time-advanced voltages.

8. The time advance circuit of claim 7, wherein the operational amplifier is configured to combine the first subset of time-advanced voltages and the second subset of time-advanced voltages to generate the output voltage that is time advanced from the input voltage by the selected time advance value.

9. The time advance circuit of claim 7, wherein:

the first subset of the plurality of time advance branches is configured to time advance the input voltage by a respective even-numbered multiple of the selected time advance value; and the second subset of the plurality of time advance branches is configured to time advance the input voltage by a respective odd-numbered multiple of the selected time advance value.

10. A power amplifier circuit comprising:

a power amplifier configured to amplify an analog signal having a time-variant power envelope based on a modulated voltage;

a phase correction circuit configured to generate a modulated phase correction voltage based on the modulated voltage to thereby cause a phase change in the analog signal; and a time advance circuit comprising:

a plurality of time advance branches each configured to time advance the modulated phase correction voltage based on a respective one of a plurality of time advance terms to generate a respective one of a plurality of time-advanced currents, wherein each of the plurality of time advance terms is a function of a selected time advance value; and an output circuit configured to combine the plurality of time-advanced currents to thereby generate a time-advanced modulated phase correction voltage that is time-advanced from the modulated phase correction voltage by the selected time advance value.

11. The power amplifier circuit of claim 10, wherein the selected time advance value corresponds to a group delay between the modulated phase correction voltage and the modulated voltage.

12. The power amplifier circuit of claim 10, further comprising a phase shifter circuit configured to:

determine a phase shift corresponding to the time-advanced modulated phase correction voltage; and phase-shift the analog signal based on the determined phase shift.

13. The power amplifier circuit of claim 10, wherein the phase correction circuit is further configured to generate the modulated phase correction voltage based on a phase lookup table (LUT) configured to correlate the modulated voltage with the modulated phase correction voltage.

14. The power amplifier circuit of claim 10, coupled to an envelope tracking (ET) integrated circuit (ETIC) configured to generate the modulated voltage based on a modulated target voltage.

15. The power amplifier circuit of claim 14, coupled to a transceiver circuit configured to:

generate the analog signal having the time-variant power envelope; and generate the modulated target voltage based on a voltage lookup table (LUT) that correlates the time-variant power envelope with the modulated target voltage.

16. The power amplifier circuit of claim 10, wherein the plurality of time advance branches comprises:

a voltage input that receives the modulated phase correction voltage;

a current output that outputs the respective one of the plurality of time-advanced currents;

a capacitor coupled in series with a current conveyor circuit between the voltage input and the current output;

a first resistor coupled between a first coupling node and a ground, wherein the first coupling node is located in between the capacitor and the current conveyor circuit;

a second resistor and a third resistor coupled in series between the voltage input and the ground; and a second coupling node coupled to the current conveyor circuit, wherein the second coupling node is located in between the second resistor and the third resistor.

17. The power amplifier circuit of claim 10, wherein the output circuit comprises:

a current combiner configured to combine the plurality of time-advanced currents to generate an output current; and an output resistor coupled to the current combiner and configured to convert the output current into the time-advanced modulated phase correction voltage that is time-advanced from the modulated phase correction voltage by the selected time advance value.

18. The power amplifier circuit of claim 10, wherein the output circuit comprises an operational amplifier, and the operational amplifier comprises:

an output terminal that outputs the time-advanced modulated phase correction voltage;

a positive input terminal coupled to a first subset of the plurality of time advance branches each configured to generate a respective one of a first subset of the plurality of time-advanced currents;

a negative input terminal coupled to a second subset of the plurality of time advance branches each configured to generate a respective one of a second subset of the plurality of time-advanced currents;

a resistor coupled between the positive input terminal and a ground, the resistor is configured to convert the first subset of the plurality of time-advanced currents into a first subset of time-advanced voltages; and a resistor-capacitor (RC) circuit coupled between the negative input terminal and the output terminal, the RC circuit is configured to convert the second subset of the plurality of time-advanced currents into a second subset of time-advanced voltages.

19. The power amplifier circuit of claim 18, wherein the operational amplifier is configured to combine the first subset of time-advanced voltages and the second subset of time-advanced voltages to generate the time-advanced modulated phase correction voltage that is time advanced from the modulated phase correction voltage by the selected time advance value.

20. The power amplifier circuit of claim 18, wherein:

the first subset of the plurality of time advance branches is configured to time advance the modulated phase correction voltage by a respective even-numbered multiple of the selected time advance value; and the second subset of the plurality of time advance branches is configured to time advance the modulated phase correction voltage by a respective odd-numbered multiple of the selected time advance value.

* * * * *